US010297456B2

(12) United States Patent
Alamariu et al.

(10) Patent No.: US 10,297,456 B2
(45) Date of Patent: May 21, 2019

(54) DIELECTRIC STRUCTURES FOR NITRIDE SEMICONDUCTOR DEVICES

(71) Applicant: Massachusetts Institute of Technology, Cambridge, MA (US)

(72) Inventors: Bernard A. Alamariu, Newton, MA (US); Omair I. Saadat, Cambridge, MA (US); Tomas Apostol Palacios, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/473,167

(22) Filed: Mar. 29, 2017

(65) Prior Publication Data

US 2017/0301546 A1 Oct. 19, 2017

Related U.S. Application Data

(63) Continuation-in-part of application No. PCT/US2015/052880, filed on Sep. 29, 2015.
(Continued)

(51) Int. Cl.
*H01L 21/28* (2006.01)
*H01L 21/8238* (2006.01)
(Continued)

(52) U.S. Cl.
CPC .. *H01L 21/28264* (2013.01); *H01L 21/02164* (2013.01); *H01L 21/02175* (2013.01); *H01L 21/02238* (2013.01); *H01L 21/02241* (2013.01); *H01L 21/02255* (2013.01); *H01L 21/823462* (2013.01); *H01L 21/823857* (2013.01); *H01L 29/2003* (2013.01); *H01L 29/513* (2013.01);
(Continued)

(58) Field of Classification Search
None
See application file for complete search history.

(56) References Cited

U.S. PATENT DOCUMENTS 6,770,922 B2 * 8/2004 Inoue ................ H01L 21/28264
257/192
6,815,299 B2 11/2004 Kiritani
(Continued)

FOREIGN PATENT DOCUMENTS

JP 2005-268507 A 9/2005

OTHER PUBLICATIONS

International Search Report and Written Opinion for Application No. PCT/US2015/052880 dated Dec. 9, 2015.
(Continued)

*Primary Examiner* — Minh Loan Tran
(74) *Attorney, Agent, or Firm* — Wolf, Greenfield & Sacks, P.C.

(57) ABSTRACT

A dielectric structure for a nitride semiconductor device and a method of forming the same. A semiconductor device includes at least one semiconductor layer. The at least one semiconductor layer includes a gallium nitride semiconductor material. The semiconductor device also includes an oxidized layer disposed over the at least one semiconductor layer. The oxidized layer includes an oxidized form of the gallium nitride semiconductor of the at least one semiconductor layer. A silicon oxide layer is disposed over the oxidized layer. A gate is disposed over the silicon oxide layer.

11 Claims, 5 Drawing Sheets

Related U.S. Application Data

(60) Provisional application No. 62/056,724, filed on Sep. 29, 2014.

(51) Int. Cl.
*H01L 21/8234* (2006.01)
*H01L 29/51* (2006.01)
*H01L 29/20* (2006.01)
*H01L 29/778* (2006.01)
*H01L 21/02* (2006.01)

(52) U.S. Cl.
CPC ........ *H01L 29/517* (2013.01); *H01L 29/7786* (2013.01)

(56) References Cited

U.S. PATENT DOCUMENTS

| | | |
|---|---|---|
| 7,754,550 B2 | 7/2010 | Chiola et al. |
| 2003/0160265 A1 | 8/2003 | Inoue et al. |

OTHER PUBLICATIONS

International Preliminary Report on Patentability for Application No. PCT/US2015/052880 dated Apr. 13, 2017.

Bae et al., Work-function difference between Al and n-GaN from Al-gated n-GaN/nitride-thin-Ga2O3/SiO2 metal oxide semiconductor structures. Applied Physics Letters. Jun. 2004;84(26):5413-5.

Cook et al., Measurement of the band offsets of SiO2 on clean n- and p-type GaN(0001). Journal of Applied Physics. Apr. 2003;93(7):3995-4004.

Das et al., AlGaN/ GaN nanoscale HEMT with Arc shaped gate and stacked HfO2—SiO2 gate dielectric. International Conference on Green Computing Communication and Electrical Engineering (ICGC-CEE). 2014: 4pgs.

Masato et al., Novel high drain breakdown voltage ALGaN/GaN HFETs using selective thermal oxidation process. International Electron Devices Meeting. Technical Digest. 2000:377-80.

Nakano et al., Characteristics of SiO2/n-GaNSiO2/n-GaN interfaces with β-Ga2O3β-interlayers. Applied Physics Letters. Nov. 2003;83(21):4336-8.

Nakono et al., Interface properties of thermally oxidized n-GaN metal-oxide-semiconductor capacitors. Applied Physics Letters. Jan. 2003; 82(2):218-20.

Sreenidhi et. al., Thermally Oxidized LPCVD Silicon as Gate Dielectric on GaN. 2nd International Workshop on Electron Devices and Semiconductor Technology. 2009: 1-4.

\* cited by examiner

DIELECTRIC STRUCTURES FOR NITRIDE SEMICONDUCTOR DEVICES

CROSS-REFERENCE TO RELATED APPLICATIONS

This application is a Continuation-in-Part of International Application No. PCT/US2015/052880, filed on Sep. 29, 2015, titled "Dielectric Structures for Nitride Semiconductor Devices," which claims priority to U.S. provisional application Ser. No. 62/056,724, titled "Dielectric Technology for Nitride Semiconductor Devices," filed Sep. 29, 2014, each of which is hereby incorporated by reference in its entirety.

GOVERNMENT SPONSORSHIP

This invention was made with Government support under contract No. N00014-10-1-0937 awarded by the Office of Naval Research. The Government has certain rights in the invention.

BACKGROUND

1. Field of Invention

The techniques described herein relate to dielectric structures for semiconductor devices, and in particular to gate dielectrics for semiconductor transistors that include a III-nitride semiconductor material.

2. Discussion of the Related Art

Improved power transistors are desired for advanced transportation systems, more robust energy delivery networks and new approaches to high-efficiency electricity generation and conversion. Applications of power transistors include power supplies, automotive electronics, automated factory equipment, motor controls, traction motor drives, high voltage direct current (HVDC) electronics, lamp ballasts, telecommunications circuits and display drives, for example. Such systems rely on efficient converters to step-up or step-down electric voltages, and use power transistors capable of blocking large voltages and/or carrying large currents. In hybrid vehicles, for example, power transistors with blocking voltages of more than 500 V are used to convert DC power from the batteries to AC power to operate the electric motor.

Conventional power devices (e.g., transistors or diodes) used in such applications are made of silicon. However, the limited critical electric field of silicon and its relatively high resistance causes available commercial devices, circuits and systems to be very large and heavy, and operate at low frequencies. Therefore, such commercial devices are unsuitable for future generations of hybrid vehicles and other applications.

Nitride semiconductor devices have been proposed as offering the potential for producing high-efficiency power electronics demanding high blocking voltages and low on-resistances.

SUMMARY

Some embodiments relate to a semiconductor device. The semiconductor device includes at least one semiconductor layer. The at least one semiconductor layer includes a gallium nitride semiconductor material. The semiconductor device also includes an oxidized layer disposed over the at least one semiconductor layer. The oxidized layer includes an oxidized form of the gallium nitride semiconductor of the at least one semiconductor layer. A silicon oxide layer is disposed over the oxidized layer. A gate is disposed over the silicon oxide layer.

Some embodiments relate to a method of forming a semiconductor device. The method includes forming a layer of polysilicon over at least one semiconductor layer that includes a gallium nitride semiconductor material. The method also includes thermally oxidizing the layer of polysilicon to form a layer of silicon oxide. The method further includes thermally oxidizing a portion of the at least one semiconductor layer by introducing oxidizing species through the layer of silicon oxide.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques described herein.

DETAILED DESCRIPTION

Figure 1:
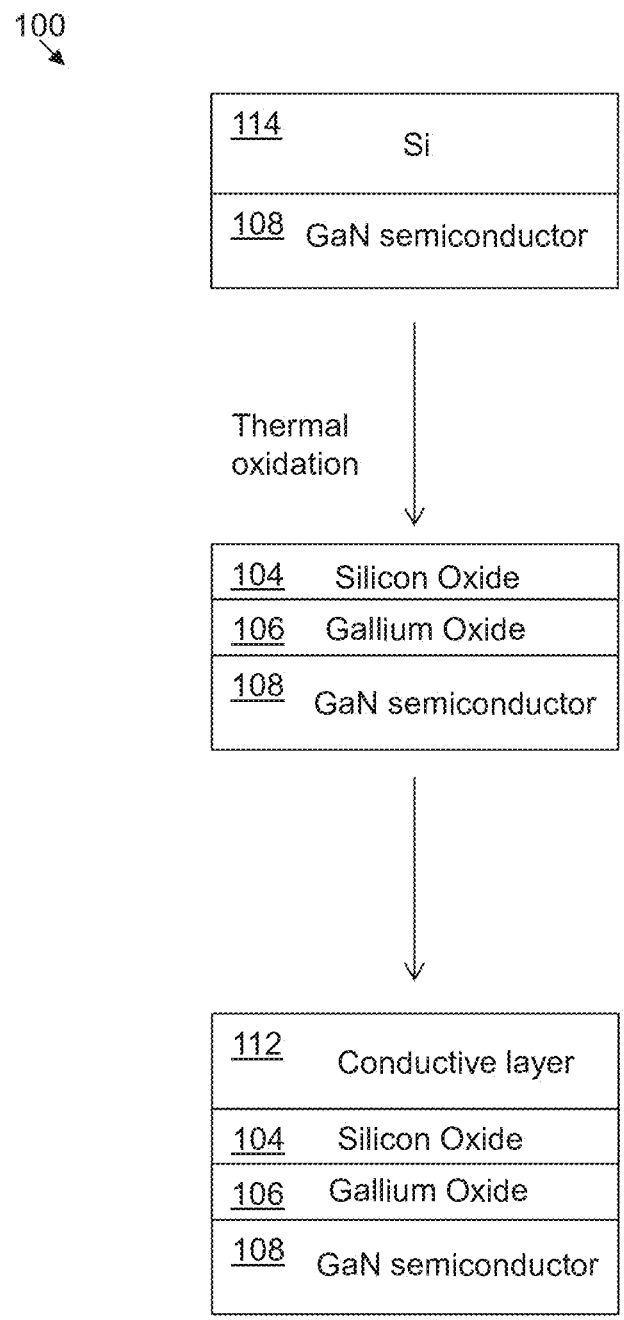
FIG. 1 is a flowchart illustrating a method of forming a dielectric structure of a nitride semiconductor device.

The potential for nitride semiconductor devices for power electronics is limited by the breakdown voltage and leakage current that can be obtained. Improved breakdown and reduced leakage current can be facilitated by improving the quality of the gate dielectric. Although silicon semiconductor devices can include a high quality native $SiO_2$ gate dielectric that is produced by thermal oxidation of the silicon device layer, nitride semiconductor materials, by contrast, do not form a native oxide of comparable quality. Attempts have been made to oxidize gallium nitride (GaN), however, it has been demonstrated that oxidizing exposed GaN forms a layer of $Ga_2O_3$ of low quality. (Bae, Choelhwyi, et al. "Work-function difference between Al and n-GaN from Al-gated n-GaN/nitrided-thin-$Ga_2O_3$/$SiO_2$ metal oxide semiconductor structures." Applied Physics Letters 84 (2004): 5413). Attempts have also been made to form a gate oxide by depositing $SiO_2$ over the GaN surface (e.g., by chemical vapor deposition), but the resulting oxide layer does not approach the same quality as thermally grown oxide.

The techniques and devices described herein have been developed by the present inventors in view of the shortcomings of prior techniques for forming gate dielectrics for nitride semiconductor devices. In some embodiments, a thermally-grown layer of $SiO_2$ is produced by depositing a layer of poly silicon over a gallium nitride semiconductor material, then thermally oxidizing the deposited polysilicon layer. The resulting layer of $SiO_2$ is a high-quality oxide which has improved properties and quality over deposited oxides (e.g., those produced by chemical vapor deposition). In some embodiments, the thermal oxidation is continued through the entire thickness of the polysilicon layer and beyond to additionally oxidize the uppermost layer of the gallium nitride semiconductor material. The resulting structure has a thin layer of gallium oxide ($Ga_2O_3$) at the interface between the gallium nitride semiconductor material and the $SiO_2$ dielectric. Temperature control of thermal oxidation also allows for better control of the oxidation rate of the silicon and the nitride semiconductor material than oxide deposition processes. Oxidizing species (e.g., oxygen and/or water) may diffuse through the silicon dioxide layer to reach the underlying nitride semiconductor layer. In contrast to prior techniques that involved oxidizing exposed GaN, the present inventors have found that thermally oxidizing the GaN while the surface is protected by another layer (e.g., $SiO_2$) results in gallium oxide of superior quality. The $SiO_2$ layer limits the rate of oxidation of the nitride semiconductor by limiting the diffusion rate of oxidizing species, especially when the thermal oxidation process occurs at lower temperatures, which is believed to result in gallium oxide of improved quality. Increasing the thickness of the deposited silicon can decrease the rate at which oxidizing species reach the nitride semiconductor. In this manner, the silicon layer and/or silicon dioxide layer may act to control the rate of oxidation and to protect the gallium oxide layer during oxidation.

The present inventors have found that such a technique not only produces a high quality dielectric material, but also results in a high-quality interface with a low density of interface traps. Since the gallium oxide is formed by oxidizing the nitride semiconductor, it may be considered a native oxide. Interfaces between a native oxide and the native semiconductor material can exhibit a low density of interface traps and a high electrical breakdown voltage. Dielectric structures described herein may have a density of interface traps lower than $5 \times 10^{12}$ cm$^{-2}$ such as lower than $10^{12}$ cm$^{-2}$, even as low as $10^{10}$ cm$^{-2}$, while conventional techniques may have a density of interface traps on the order of $10^{13}$ cm$^{-2}$. In some embodiments, the dielectric structure may have a density of interface traps lower than $1 \times 10^{11}$ cm$^{-2}$.

FIG. 1 shows an exemplary method 100 of forming a dielectric structure, according to some embodiments. Method 100 includes forming silicon layer 114 on or over a GaN-based semiconductor layer 108. GaN-based semiconductor layer 108 includes a gallium nitride (GaN) semiconductor material, which may be GaN or another composition that includes gallium and nitrogen as well as one or more of indium, aluminum or boron. Silicon layer 114 may be polysilicon. Any suitable technique may be used to form the polysilicon, including one or more deposition techniques such as low pressure chemical vapor deposition (LPCVD), plasma-enhanced chemical vapor deposition (PECVD), sputtering, e-beam evaporation, or combinations thereof. In embodiments where LPCVD is used to form silicon layer 114, any suitable process parameters may be used to deposit silicon at a rate in the range of 3 Å/min to 30 Å/min, for example. The temperature may be in the range of 500° C. to 625° C. The flow rate of $SiH_4$ gas may be in the range of 50 sccm to 200 sccm. The pressure may be in the range of 50 mTorr to 350 mTorr. In a non-limiting example, a layer of polysilicon can be deposited by LPCVD on a nitride semiconductor at a deposition rate of 5 Å/min at a temperature of 515° C. at a pressure of 200 mTorr with a $SiH_4$ gas flow of 100 sccm. However, the techniques described herein are not limited as to specific process parameters or deposition rates.

GaN-based semiconductor layer 108 may have any suitable thickness. In some embodiments, GaN-based semiconductor layer 108 may have a thickness in the range of 1 micron to 4 microns. GaN-based semiconductor layer 108 may be formed on any suitable substrate, such as a sapphire substrate, for example. In some embodiments, GaN-based semiconductor layer 108 may be a GaN substrate.

Although only one GaN-based semiconductor layer 108 is shown in FIG. 1, GaN-based semiconductor layer 108 may include one or more semiconductor layers. In some embodiments, nitride semiconductor 108 includes an AlGaN layer formed on a GaN layer. The thickness of the AlGaN layer may be in the range of 150 nm to 300 nm, for example. The thickness of the GaN layer may be in the range of 2 microns to 3.5 microns, for example. In some embodiments, GaN-based semiconductor layer 108 includes an InGaN layer formed on a GaN layer.

Silicon layer 114 may have any suitable thickness. In some embodiments, the thickness of silicon layer 114 may be 40 nm or less, such as 35 nm or less, 30 nm or less, 25 nm or less, 20 nm or less, 15 nm or less, 10 nm or less or 5 nm or less.

Method 100 includes thermally oxidizing silicon layer 114 to form silicon oxide layer 104 and gallium oxide layer 106, as shown in FIG. 1. Thermal oxidation may be performed in a dry environment (e.g., with oxygen gas), a wet environment (e.g., with water vapor), an environment with a combination of oxygen gas and water vapor, a nitrous oxide environment, or a nitric oxide environment. Silicon oxide layer 104 may have any suitable thickness. Silicon oxide layer 104 may have a thickness in the range of 0.5 nm to 90 nm, in some embodiments. Silicon oxide layer 104 may have a thickness of approximately 0.8 nm, approximately 2 nm, approximately 3 nm, or approximately 5 nm, by way of example.

Any suitable technique for oxidizing silicon layer 114 may be used, including thermal oxidation techniques. Thermal oxidation techniques may include heating GaN-based semiconductor layer 108 and silicon layer 114 in the presence of oxygen-containing species at a temperature sufficiently high enough to oxidize silicon layer 114 to form silicon oxide layer 104 and to oxidize a portion of GaN-based semiconductor layer 108 to form gallium oxide layer 106. The temperature used for thermal oxidation may be less than 900° C., in some embodiments. In some embodiments, the temperature used for thermal oxidation may be less than 700°. In some embodiments, the temperature used for thermal oxidation may be in the range of 500° C. to 750° C. In some embodiments, the temperature used for thermal oxidation may be approximately 700° C. In some embodiments, thermal oxidation of silicon layer 114 occurs in a wet environment at a temperature of less than approximately 700° C. In embodiments where the oxidation occurs at a high pressure, the temperature used for thermal oxidation may be at least 300° C. The oxidation time may be in the range of 20 minutes to 120 minutes. As a non-limiting example, oxidation of a polysilicon layer to form silicon dioxide layer 104 may occur by a thermal oxidation process that includes heating at a temperature of 700° C. in a wet environment for 100 minutes.

The oxidation process used to oxidize silicon layer 114 may also oxidize a portion of GaN-based semiconductor layer 108 to form gallium oxide layer 106 (e.g., $Ga_2O_3$, beta-$Ga_2O_3$). Oxidation of GaN-based semiconductor layer 108 may occur through diffusion of oxidizing species through silicon dioxide layer 104 such that a region of GaN-based semiconductor layer 108 proximate to silicon layer 114 forms gallium oxide layer 106. In this manner, gallium oxide layer 106 is formed between silicon oxide layer 104 and GaN-based semiconductor layer 108 such that gallium oxide 106 forms an interface with GaN-based semiconductor layer 108.

Gallium oxide layer 106 may have any suitable thickness, which may be controlled by the oxidation time, temperature, thickness of silicon layer 114 and/or thickness of silicon oxide layer 104. In some embodiments, gallium oxide layer 106 may have a thickness between 1 nm and 100 nm, such as in the range of 2 nm to 10 nm, including approximately 5 nm or approximately 7 nm, by way of example. After forming the dielectric structure in method 100, the gate may be formed by forming conductive layer 112 on oxide layer 104. Conductive layer 112 may be formed using any suitable technique, including deposition processes (e.g., PECVD, ALD) and sputtering, by way of example and not limitation.

In some embodiments, GaN-based semiconductor layer 108 includes a second GaN layer formed on the AlGaN layer. The second GaN layer may have a thickness in the range of 1 nm to 3 nm, for example. In some embodiments, the second GaN layer may have a thickness of less than 5 nm. In embodiments where GaN-based semiconductor layer 108 includes an InGaN layer formed on a GaN layer, the GaN-based semiconductor layer 108 may include a second GaN layer formed on the InGaN layer.

Figure 2:
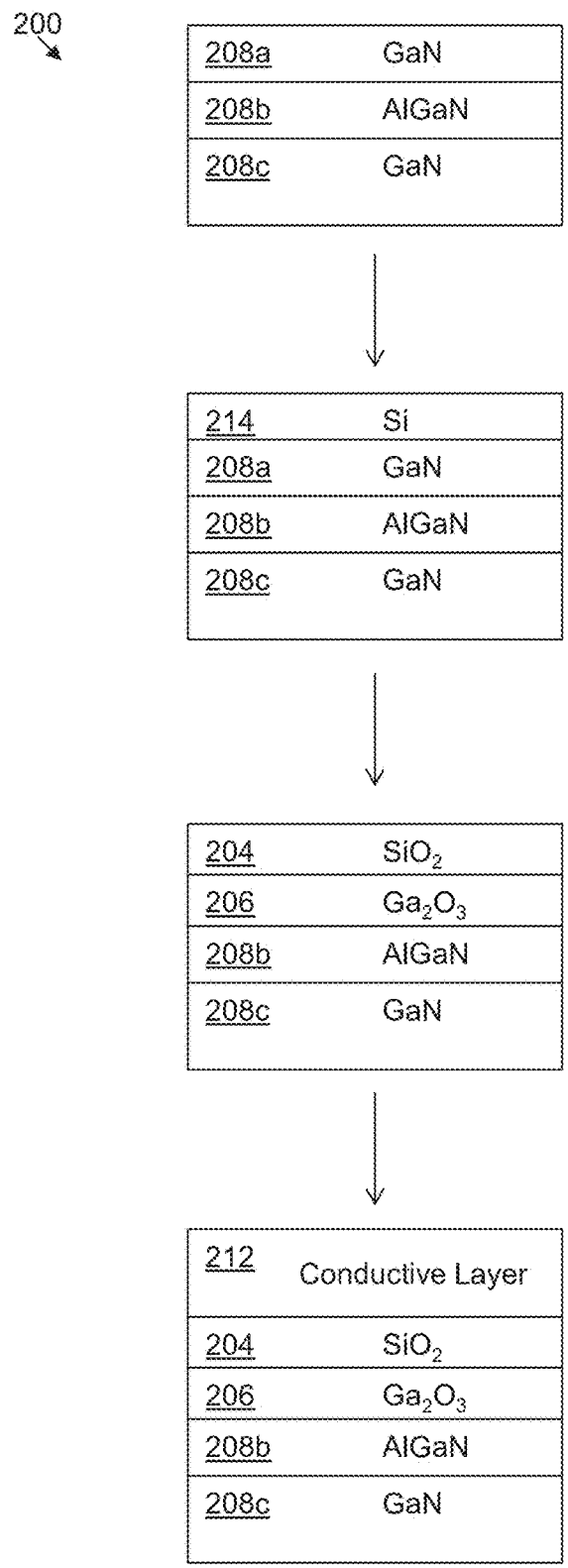
FIG. 2 is a flowchart illustrating an exemplary method of forming a dielectric structure by forming a sacrificial GaN layer.

As shown in FIG. 2, in some embodiments, silicon layer 214 is formed on or over a layer of GaN. A layer of GaN may be included in GaN-based semiconductor layer 108 and/or formed on or over the GaN-based semiconductor layer 108 before forming silicon layer 214 over the layer of GaN. During the oxidation process, oxidation of at least a portion of the layer of GaN may form gallium oxide layer 106. The layer of GaN may reduce diffusion of one or more species from GaN-based semiconductor layer 108 into silicon layer 114 and/or silicon oxide layer 104 during oxidation. The GaN layer may protect other layers in GaN-based semiconductor layer 108 (e.g., AlGaN) from oxidation, which may degrade the quality of those layers and affect device performance. In this manner, the GaN layer may act as a sacrificial layer for the formation of the gallium oxide layer by oxidation.

FIG. 2 illustrates steps in an exemplary method 200 of forming a dielectric structure by forming a sacrificial GaN layer. Method 200 includes forming GaN layer 208a on or over AlGaN layer 208b such that AlGaN layer 208b is positioned between GaN layer 208a and GaN layer 208c. GaN layer 208a may have a thickness in the range of 1 nm to 5 nm, for example. AlGaN layer 208b may have a thickness in the range of 100 nm to 300 nm, for example. GaN layer 208c may have a thickness in the range of 2 microns to 4 microns, for example.

Method 200 includes forming silicon layer 214 on GaN layer 208a. The thickness of silicon layer 214 may be 20 nm or less, such as 15 nm or less, 10 nm or less, or 5 nm or less. Silicon layer 214 may be polysilicon, as with silicon layer 114. Silicon layer 214 may be formed by low pressure chemical vapor deposition (LPCVD). In some embodiments, silicon layer 214 may be formed by LPCVD at approximately 515° C. Method 200 may include oxidizing silicon layer 214 to form $SiO_2$ layer 204. As part of the oxidation process, oxidation of GaN layer 208a may occur and form $Ga_2O_3$ layer 206 positioned between AlGaN layer 208b and $SiO_2$ layer 204. $Ga_2O_3$ layer 206 and AlGaN layer 208b form an interface.

After forming the dielectric structure in method 200, a gate may be formed by forming conductive layer 212 on or over $SiO_2$ layer 204. If the steps of method 200 are used to form a device, such as a transistor, then $SiO_2$ layer 204 and $Ga_2O_3$ layer 206 may form a dielectric structure between AlGaN layer 208b and conductive layer 212.

Figure 3:
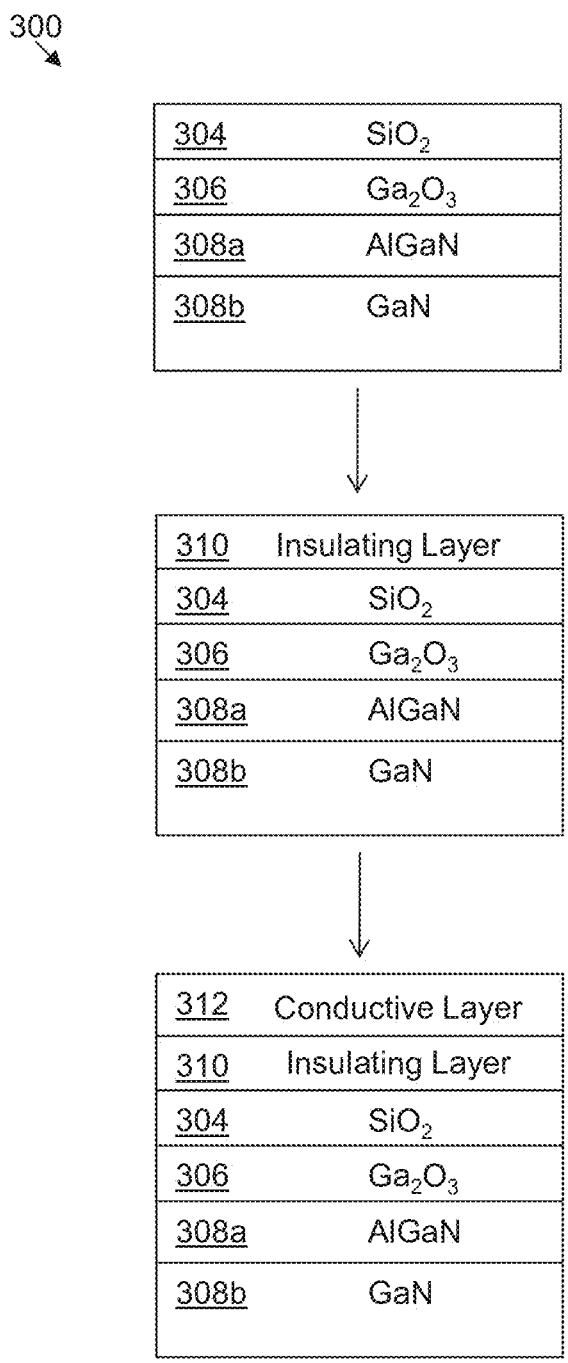
FIG. 3 is a flowchart illustrating an exemplary method of forming an insulating layer as part of a dielectric structure.

As shown in FIG. 3, in some embodiments an insulating layer is formed on or over the silicon oxide layer and a conductive layer is formed on or over the insulating layer such that the insulating layer is positioned between the silicon oxide layer and the conductive layer. The insulating layer may form an additional layer as part of the dielectric structure between the GaN-based semiconductor layer and the conductive layer. The insulating layer may improve the breakdown voltage, current leakage, and/or threshold voltage of the resulting device. The insulating layer may be formed by any suitable techniques such as by deposition (PECVD, ALD) e-beam, and/or sputtering. The insulating layer may include $Si_3N_4$, $Al_2O_3$, and/or $HfO_2$, by way of example.

FIG. 3 illustrates steps in an exemplary method 300 of forming an insulating layer as part of a dielectric structure. Method 300 includes forming insulating layer 310 on a structure that includes GaN-based semiconductor layers, AlGaN 308a and GaN 308b, $Ga_2O_3$ layer 306 and $SiO_2$ layer 304. The insulating layer 310 is formed on $SiO_2$ layer 304. After forming insulating layer 310, a gate may be formed by forming conductive layer 312 on or over insulating layer 310. If the steps of method 300 are used to form a device, such as a transistor, then $SiO_2$ layer 304, $Ga_2O_3$ layer 306, and insulating layer 310 may form a dielectric structure between AlGaN layer 308a and conductive layer 312.

In some embodiments, an InGaN layer may be used in methods 200 and 300 instead of an AlGaN layer in forming a dielectric structure. In such embodiments, a method of forming a dielectric structure may include forming a GaN-based structure having a first GaN layer, an InGaN layer on or over the first GaN layer, and a second GaN layer formed over the InGaN layer and oxidizing the second GaN layer. The oxidized GaN layer (e.g., $Ga_2O_3$ layer) and the InGaN layer may form an interface.

The steps of the methods discussed above may be used to form a nitride semiconductor device that includes a dielectric structure according to the techniques described herein. Subsequent steps may include forming additional components depending on the type of device being formed. For a transistor, a conductive layer may act as a gate electrode and source and drain regions may be formed such that the GaN-based semiconductor layer acts as a channel. Since forming source and drain regions before a gate dielectric may impact the quality of the gate dielectric, some embodiments include forming the gate dielectric before source and drain regions to maintain the quality of the gate dielectric. Any suitable techniques may be used to form additional device components including source and drain regions. Forming the gate and gate dielectric prior to fabricating other components may provide certain benefits in the properties of the resulting device. The gate dielectric may be protected from further processing of the device such that the quality of the silicon oxide layer, the gallium oxide layer and/or the interface between the gallium oxide layer and the GaN-based semiconductor layer may experience reduced degradation during formation of the semiconductor device.

Figure 4:
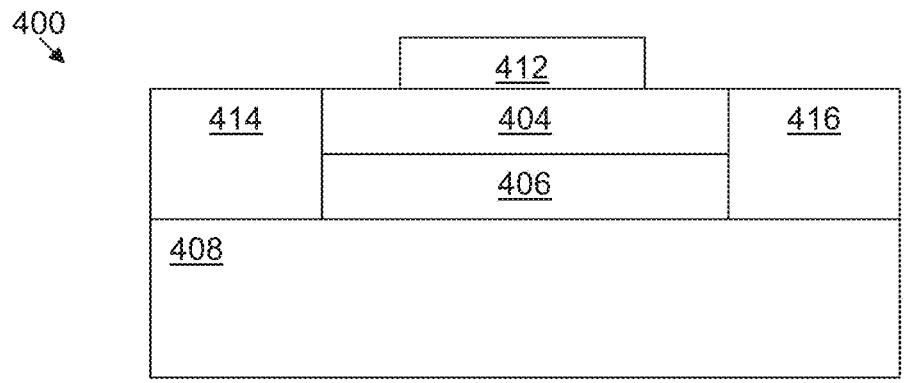
FIG. 4 is a cross-sectional diagram illustrating a GaN-based semiconductor device having a dielectric structure, according to some embodiments.
Figure 5:
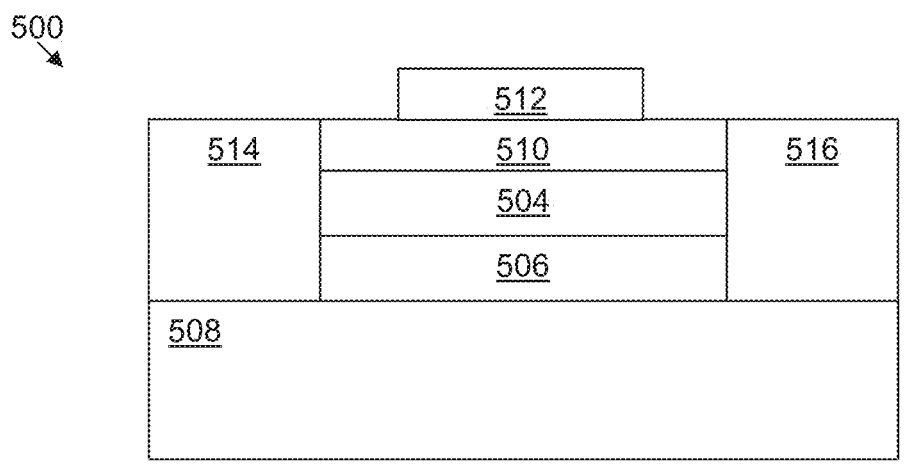
FIG. 5 is a cross-sectional diagram illustrating a GaN-based semiconductor device having a dielectric structure, according to some embodiments.

Exemplary devices formed by the methods illustrated in FIGS. 1-3 will now be described with reference to FIGS. 4-5.

Some embodiments relate to a GaN-based semiconductor device having a dielectric structure where the dielectric structure includes a gallium oxide layer. As discussed above, a dielectric structure formed on a GaN-based semiconductor layer may include a silicon oxide layer and a gallium oxide layer between the GaN-based semiconductor and the silicon oxide layer. FIG. 4 shows a cross-sectional diagram of exemplary semiconductor transistor 400 that includes a dielectric structure according to the techniques described herein. Transistor 400 includes GaN-based semiconductor layer 408 and a dielectric structure that includes gallium oxide layer 406 on GaN-based semiconductor layer 408 and silicon oxide layer 404 formed over gallium oxide layer 406. GaN-based semiconductor layer 408 may include a channel for transistor 400. Gate electrode 412 is positioned over silicon oxide layer 404. Transistor 400 includes source and drain regions 414 and 416, respectively. GaN-based semiconductor layer 408 may include multiple layers of one or more materials. Dielectric structure 402 includes gallium oxide layer 406 and silicon oxide layer 404. Gallium oxide layer 406 includes an oxidized form of the GaN-based semiconductor of layer 408, such as $Ga_2O_3$, and forms an interface with GaN-based semiconductor layer 408. Silicon oxide layer 404 may include silicon dioxide ($SiO_2$). In some embodiments, GaN-based semiconductor layer 408 is formed on a substrate (e.g., a sapphire substrate).

In some embodiments, silicon oxide layer 404 is silicon dioxide, gallium oxide layer 406 is $Ga_2O_3$, and GaN-based semiconductor layer 408 includes AlGaN and/or GaN. GaN-based semiconductor layer 408 may include an AlGaN layer and a GaN layer where the AlGaN layer is between the GaN layer and gallium oxide layer 406.

The dielectric structure may include an insulating layer positioned between the silicon oxide layer and the conductive layer. FIG. 5 shows a cross-sectional diagram of exemplary semiconductor transistor 500 that includes a dielectric structure according to the techniques described herein. Transistor 500 includes a dielectric structure having gallium oxide layer 506 formed over GaN-based semiconductor layer 508, silicon oxide layer 504 formed over gallium oxide layer 506, and insulating layer 510 formed over silicon oxide layer 504. Insulating layer 510 may include any suitable material including $Si_3N_4$, AlN, SiON, $Al_2O_3$, and/or $HfO_2$. Gate electrode 512 is positioned over insulating layer 510. Transistor 500 includes source and drain regions 514 and 516. GaN-based semiconductor layer 508 may include multiple layers of one or more materials. Gallium oxide layer 506 forms an interface with GaN-based semiconductor layer 508.

Any suitable materials may be used for forming the dielectric structures and nitride semiconductor devices that include a dielectric structure according to techniques described herein.

GaN-based semiconductor layers 108, 408, 508 may be formed of any suitable gallium nitride semiconductor material(s). A gallium nitride semiconductor material used to form a GaN-based semiconductor layer may include $B_wAl_xIn_yGa_zN$, for example, in which w, x, and y and each have any suitable value between zero and one (inclusive), z is greater than 0 and less than or equal to 1, and w+x+y+z=1. Examples of GaN-based materials include GaN, AlGaN, InAlGaN, and InGaN, by way of example and not limitation.

GaN-based semiconductor layers 108, 408, 508 may be monocrystalline, and may have any suitable orientation. Compound semiconductor materials of GaN-based semiconductor layers 108, 408, 508 may have any suitable composition at the face of the semiconductor material. If a III-N material is included, it may have an N-face composition, a group III face composition or a non-polar orientation. For example, GaN may be grown either N-face and Ga-face or in non-polar orientations.

GaN-based semiconductor layers 108, 408, 508 may be comprised of one or more materials, depending on the type of semiconductor device to be formed. Each semiconductor region may include one layer of a single material or more than one layer of different materials. In some embodiments, the semiconductor region may include a heterostructure having a plurality of layers of different semiconductor materials. In some embodiments, the plurality of layers may be materials with different bandgaps and/or polarizations, such as nitride semiconductor materials having different compositions, e.g., $B_{w1}Al_{x1}In_{y1}Ga_{z1}N$ and $B_{w2}Al_{x2}In_{y2}Ga_{z2}N$ materials.

GaN-based semiconductor layers 108, 408, 508 may be doped or undoped. If the GaN-based semiconductor layers 108, 408, 508 include a region that is doped, it may be polarization doped or may include dopants such as n-type dopants or p-type dopants, and may have any suitable doping concentration and distribution. Any suitable doping technique may be used, such as implantation or diffusion, for example.

Gallium oxide layers 106, 406, 506, may include an oxidized form of a GaN-based semiconductor. A gallium oxide layer may include a gallium oxide material having the formula $Al_xIn_yGa_zO_w$, which includes gallium and oxygen and optionally includes aluminum and/or indium. An example of a gallium oxide material includes $Ga_2O_3$, by way of example and not limitation. In some embodiments, a gallium oxide layer may include other oxides besides gallium oxide (e.g., $Al_xO_y$, $In_xO_y$). For example, oxidation of AlGaN may produce $Ga_2O_3$ and $Al_2O_3$. These other oxides may allow oxidizing species to diffuse through to oxidize the GaN-based semiconductor while providing a protective layer during oxidization of the GaN-based semiconductor.

Silicon oxide layers 104, 404, 504, may include any suitable oxide material. An oxide layer may form by forming a layer of material on a nitride semiconductor layer and oxidizing the material such that the oxide layer and a layer of oxidized nitride semiconductor material forms underneath the oxide layer. In some embodiments, an oxide layer includes silicon oxide.

Silicon is one type of material that may form an oxide layer. Several properties of silicon dioxide make it a desirable oxide to form in a dielectric structure. Silicon dioxide provides sufficient insulation useful for semiconductor devices, such as semiconductor transistors. A silicon dioxide layer can be formed to have a sufficiently low level of defects via thermal annealing because of silicon dioxide's low coordination number, which allows bonds to relax and/or fix. Defects in silicon dioxide may be at a low level because amorphous silicon dioxide incorporates low amounts of hydrogen, which can create detects and traps in devices at higher amounts. Silicon dioxide also provides a low density of electrical oxide and a low density of interface charges. Another beneficial property of silicon dioxide is its low intrinsic stress, such that it reduces the amount of stress applied to other components of a device, including one or more nitride semiconductor layers. By depositing silicon and oxidizing the silicon on both sides of a wafer, silicon oxide layers on either side of the wafer may form with similar thicknesses, which reduces the amount of stress on the device.

In embodiments where a nitride semiconductor layer includes GaN and an oxide layer includes silicon dioxide, the bandgap difference between the nitride semiconductor layer and the oxide layer may be sufficiently large to reduce the probability of electrons tunneling through the dielectric structure and/or becoming trapped in the oxide layer. The conduction band offset between the nitride semiconductor layer and the oxide layer may be at least approximately 2 eV. In some embodiments, the oxidized semiconductor layer includes $Ga_2O_3$ positioned between a nitride semiconductor layer and a silicon dioxide layer. The $Ga_2O_3$ layer and the silicon dioxide layer may form a dielectric structure that provides a sufficient amount of passivation for the nitride semiconductor layer and has an interface with a low density of interface states. When the dielectric structure is included as a gate dielectric in a nitride semiconductor transistor, the resulting transistor may have a sufficiently low gate electrical leakage current.

The versatility of silicon dioxide to form interfaces of sufficient quality with other materials allows for control of the resulting dielectric structure's total dielectric capacitance, breakdown voltage, and density of interface states. Materials used to form a layer on a silicon dioxide layer include insulating materials (e.g., $Si_3N_4$, $Al_2O_3$, and $HfO_2$) by any suitable method (plasma-enhanced chemical vapor deposition, atomic layer deposition, e-beam techniques, sputtering).

Insulating layers 310 and 510 may be formed of any suitable dielectric or insulating material, such as $Si_3N_4$, $Al_2O_3$, $SiO_2$, $HfO_2$, $Si_xO_yN_z$, $Si_xH_wO_yN_z$, or $Si_xN_y$, for example. The insulating layers 310 and 510 may include more than one dielectric material. Materials used to form an insulating layer may have a desired level of compatibility with various conductive materials (e.g., metals) that may form a gate electrode on the insulating layer such that a suitable interface forms between the insulating layer and the conductive layer. In some embodiments, the dielectric region may include a single dielectric layer or a plurality of sub-layers.

Conductive layers 112, 212, 312, 412, 412 may be formed of a conductive and/or semiconductive material(s). Examples of suitable materials to be used as a conductive layer include TiN, Al, Mo, W, TaN, doped polysilicon and doped semiconductor (e.g., GaN,).

Any suitable materials may be used for the source and drain regions 414, 416, 514, 516 such as metal(s) and/or doped semiconductor. The source and drain regions 414, 416, 514, 516 may have ohmic contacts.

Figure 6:
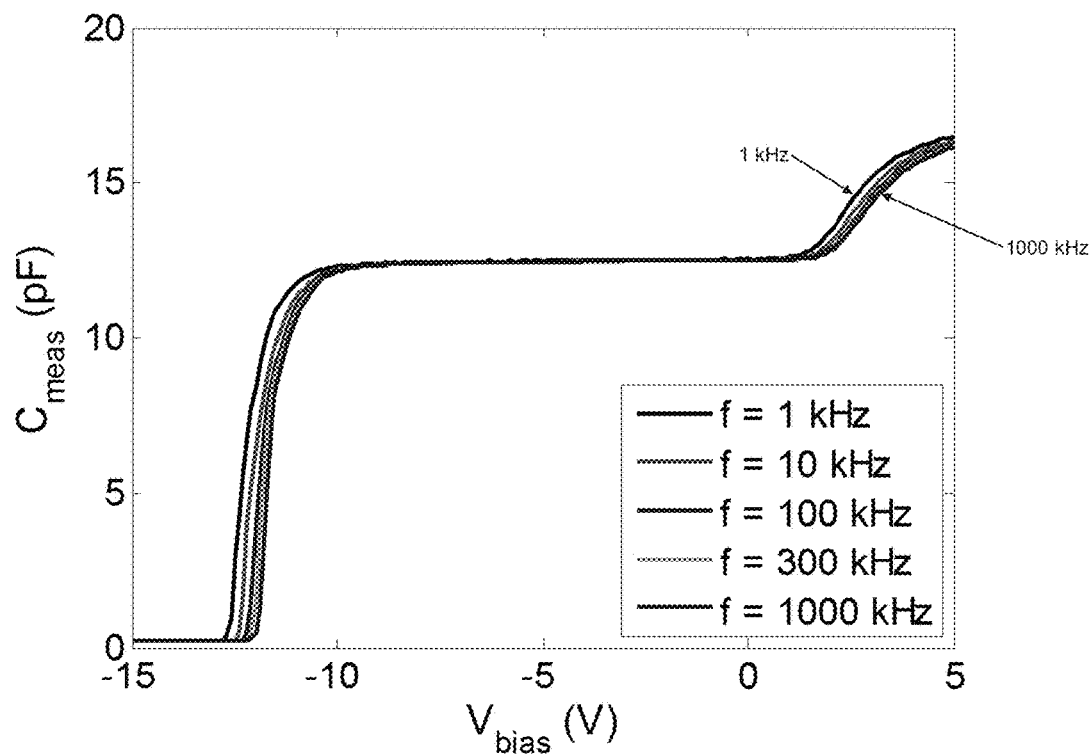
FIG. 6 is a plot of capacitance-voltage characteristics for an exemplary device having a gallium oxide layer and a silicon oxide layer.
Figure 7:
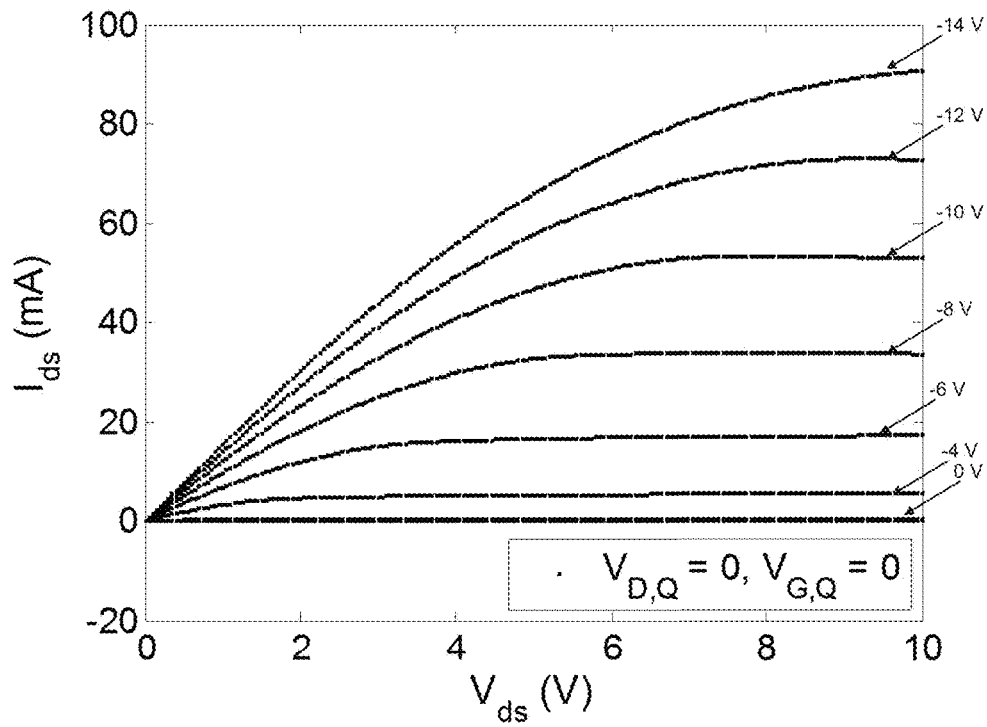
FIG. 7 is a plot of current-voltage characteristics for an exemplary device having a gallium oxide layer and a silicon oxide layer.

Characteristics of an exemplary device having a gallium oxide layer and a silicon oxide layer are shown in FIGS. 6 and 7. The device is formed by depositing 7-8 nm of polysilicon on a GaN-based semiconductor and oxidizing in a wet environment for 100 min at 700° C. FIG. 6 shows the capacitance-voltage characteristics for the device. The capacitance as a function of bias voltage is displayed for different frequencies ranging from 1 kHz to 1000 kHz. The small variation in capacitance for the different frequencies illustrates that the device has good dispersion behavior. These characteristics indicate the device has a good quality interface with a low density of interface traps (e.g., less than $5 \times 10^{12}$ cm$^{-2}$). FIG. 7 shows representative current-voltage characteristics for the device. The source-drain current is measured as a function of drain-source voltage for different gate voltages ranging from −14V to 0V. At larger drain-source voltages, the current increases up to approximately 80 mA for a gate voltage of −14V.

Additional Aspects

The techniques described herein may be applied to any type of field effect transistor. In some embodiments, the techniques described herein may be applied to power transistors. Such techniques can provide improvements in power transistors that will enable significant improvements in power electronics systems for hybrid vehicles, high efficiency power inverters for solar cells, and power converters for LEDs, for example, as well as high-speed digital electronics.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method of forming a semiconductor device, the method comprising:
   forming a layer of polysilicon over at least one semiconductor layer, the at least one semiconductor layer including a layer of gallium nitride formed over a layer of aluminum gallium nitride or a layer of indium gallium nitride;
   thermally oxidizing the layer of polysilicon to form a layer of silicon oxide; and
   thermally oxidizing at least a portion of the layer of gallium nitride to form gallium oxide by introducing oxidizing species through the layer of silicon oxide to form a layer of gallium oxide over the layer of aluminum gallium nitride or the layer of indium gallium nitride.

2. The method of claim 1, wherein thermally oxidizing the at least a portion of the layer of gallium nitride produces a gallium oxide layer positioned between the at least one semiconductor layer and the layer of silicon oxide and forms an interface with the at least one semiconductor layer.

3. The method of claim 2, wherein thermally oxidizing the at least a portion of the layer of gallium nitride further comprises forming a layer of gallium oxide that includes beta-$Ga_2O_3$.

4. The method of claim 2, wherein the interface has a density of interface traps of less than $5 \times 10^{12}$ cm$^2$.

5. The method of claim 1, wherein thermally oxidizing the layer of polysilicon is performed at a temperature of less than approximately 700° C.

6. The method of claim 5, wherein thermally oxidizing the layer of polysilicon is further performed in a wet environment.

7. The method of claim 1, wherein forming the layer of polysilicon comprises depositing the layer of polysilicon over the layer of gallium nitride.

8. The method of claim 1, further comprising forming a gate over the layer of silicon oxide.

9. The method of claim 1, further comprising forming an insulating layer over the layer of silicon oxide.

10. The method of claim 1, wherein thermally oxidizing the at least a portion of the layer of gallium nitride occurs at a rate that depends on a thickness of the layer of silicon oxide.

11. The method of claim 1, wherein forming the layer of polysilicon further comprises forming the layer of polysilicon by low pressure chemical vapor deposition (LPCVD).

* * * * *

UNITED STATES PATENT AND TRADEMARK OFFICE
CERTIFICATE OF CORRECTION

PATENT NO. : 10,297,456 B2
APPLICATION NO. : 15/473167
DATED : May 21, 2019
INVENTOR(S) : Bernard A. Alamariu et al.

It is certified that error appears in the above-identified patent and that said Letters Patent is hereby corrected as shown below:

In the Claims

At Column 10, Line 67, "$5 \times 10^{12}$ cm$^2$" should read -- $5 \times 10^{12}$ cm$^{-2}$ --

Signed and Sealed this
Tenth Day of September, 2019

Andrei Iancu
*Director of the United States Patent and Trademark Office*